(12) United States Patent
Kean

(10) Patent No.: US 12,289,554 B2
(45) Date of Patent: Apr. 29, 2025

(54) ARTIFACT MITIGATION IN CAPACITOR TRANSIMPEDANCE AMPLIFIER (CTIA)-BASED IMAGERS OR OTHER IMAGING DEVICES

(71) Applicant: Raytheon Company, Waltham, MA (US)

(72) Inventor: Bryan W. Kean, Denver, CO (US)

(73) Assignee: Raytheon Company, Arlington, VA (US)

(*) Notice: Subject to any disclaimer, the term of this patent is extended or adjusted under 35 U.S.C. 154(b) by 72 days.

(21) Appl. No.: 18/165,663

(22) Filed: Feb. 7, 2023

(65) Prior Publication Data

US 2024/0267655 A1 Aug. 8, 2024

(51) Int. Cl.
 *H04N 25/778* (2023.01)
 *H03F 3/08* (2006.01)
 *H04N 25/709* (2023.01)

(52) U.S. Cl.
 CPC .......... *H04N 25/778* (2023.01); *H03F 3/087* (2013.01); *H04N 25/709* (2023.01)

(58) Field of Classification Search
 CPC ..... H04N 25/778; H04N 25/709; H03F 3/087
 See application file for complete search history.

(56) References Cited

U.S. PATENT DOCUMENTS

| | | | |
|---|---|---|---|
| 6,121,843 A * | 9/2000 | Vampola | H03F 3/082 330/308 |
| 6,252,462 B1 | 6/2001 | Hoffman | |
| 6,885,002 B1 | 4/2005 | Finch et al. | |
| 6,927,796 B2 | 8/2005 | Liu et al. | |
| 7,148,727 B2 | 12/2006 | Van Bogget | |
| 9,621,829 B1 * | 4/2017 | Boemler | H04N 25/77 |
| 9,628,105 B1 | 4/2017 | Veeder | |
| 10,242,268 B2 | 3/2019 | Harris et al. | |

(Continued)

FOREIGN PATENT DOCUMENTS

| | | | |
|---|---|---|---|
| CN | 102523394 B | * | 4/2014 |
| CN | 107563202 B | * | 12/2020 |

(Continued)

OTHER PUBLICATIONS

Notice of Allowance dated Oct. 3, 2023 in connection with U.S. Appl. No. 17/480,554, 13 pages.

(Continued)

*Primary Examiner* — Chiawei Chen

(57) ABSTRACT

An apparatus includes a photodetector configured to generate an electrical current based on received illumination. The apparatus also includes a capacitor transimpedance amplifier (CTIA) unit cell having (i) an amplifier configured to receive the electrical current and a first reference voltage and generate a pre-integration voltage, (ii) a feedback capacitor coupled in parallel across the amplifier, (iii) a reset switch coupled in parallel across the feedback capacitor, and (iv) a coupling capacitor coupled to an output of the amplifier and configured to receive the pre-integration voltage and generate an integration voltage. The apparatus further includes a comparator configured to compare the pre-integration voltage and a second reference voltage, where generation of the integration voltage is modifiable based on the comparison.

20 Claims, 6 Drawing Sheets

(56) References Cited

U.S. PATENT DOCUMENTS

| | | |
|---|---|---|
| 11,496,701 B2 | 11/2022 | Cantrell |
| 11,843,355 B2 | 12/2023 | Kean et al. |
| 12,029,599 B2 | 7/2024 | Cao et al. |
| 2003/0150979 A1 | 8/2003 | Lauffenburger et al. |
| 2005/0199813 A1 | 9/2005 | Van Bogget |
| 2008/0106297 A1 | 5/2008 | Jao |
| 2008/0218614 A1* | 9/2008 | Joshi ............... H04N 25/779 348/262 |
| 2011/0221520 A1 | 9/2011 | Bales |
| 2012/0261553 A1 | 10/2012 | Elkind et al. |
| 2012/0305786 A1 | 12/2012 | Dierickx |
| 2013/0187028 A1* | 7/2013 | Salvestrini ............ H04N 23/11 250/208.1 |
| 2014/0061472 A1* | 3/2014 | Salvestrini ............ H04N 25/75 250/339.02 |
| 2017/0205283 A1 | 7/2017 | Wyles et al. |
| 2018/0124336 A1 | 5/2018 | Jonas |
| 2019/0313046 A1 | 10/2019 | McGee, III et al. |
| 2019/0335118 A1 | 10/2019 | Simolon et al. |
| 2022/0311960 A1 | 9/2022 | Cantrell |
| 2023/0095511 A1 | 3/2023 | Boemler |
| 2023/0253932 A1* | 8/2023 | Kean ................. H03F 3/087 330/308 |
| 2023/0269502 A1* | 8/2023 | Black ............... G01R 19/0038 348/302 |

FOREIGN PATENT DOCUMENTS

| | | | |
|---|---|---|---|
| CN | 115876320 A | * | 3/2023 |
| CN | 115914872 B | * | 3/2024 |
| TW | I287818 B | | 10/2007 |

OTHER PUBLICATIONS

Non-Final Office Action dated Apr. 19, 2023 in connection with U.S. Appl. No. 17/480,554, 11 pages.

Notice of Allowance dated Mar. 15, 2023 in connection with U.S. Appl. No. 17/649,994, 9 pages.

Non-Final Office Action dated Apr. 9, 2024 in connection with U.S. Appl. No. 18/165,713, 7 pages.

Abbasi et al., "A PFM-Based Digital Pixel with an Off-Pixel Residue Measurement for Small Pitch FPAs," IEEE Transactions on Circuits and Systems—II: Express Briefs, vol. 64, No. 8, Aug. 2017, 5 pages.

Bisiaux et al., "A 14-b Two-step Inverter-based ΣΔADC for CMOS Image Sensor," 15th IEEE International New Circuits and Systems Conference, Nov. 2017, 4 pages.

Kean et al., "High-Energy Suppression for Capacitor Transimpedance Amplifier (CTIA)-Based Imagers or Other Imaging Devices," U.S. Appl. No. 17/649,994, filed Feb. 4, 2022, 30 pages.

Kean, "High Flux Detection and Imaging Using Capacitor Transimpedance Amplifier (CTIA)-Based Unit Cells in Imaging Devices," U.S. Appl. No. 18/165,713, filed Feb. 7, 2023, 49 pages.

Final Office Action dated Jul. 19, 2024 in connection with U.S. Appl. No. 18/165,713, 8 pages.

* cited by examiner

ARTIFACT MITIGATION IN CAPACITOR TRANSIMPEDANCE AMPLIFIER (CTIA)-BASED IMAGERS OR OTHER IMAGING DEVICES

TECHNICAL FIELD

This disclosure relates generally to imaging systems. More specifically, this disclosure relates to artifact mitigation in capacitor transimpedance amplifier (CTIA)-based imagers or other imaging devices.

BACKGROUND

Digital imaging systems often use integrators to capture information when generating digital images. For example, an electrical current from a pixel can be integrated during an integration period, and a generated voltage as a result of the integration can be sampled and used to generate image data for that pixel. This process can be performed for each pixel in an imaging array in order to generate image data for the array.

SUMMARY

This disclosure relates to artifact mitigation in capacitor transimpedance amplifier (CTIA)-based imagers or other imaging devices.

In a first embodiment, an apparatus includes a photodetector configured to generate an electrical current based on received illumination. The apparatus also includes a CTIA unit cell having (i) an amplifier configured to receive the electrical current and a first reference voltage and generate a pre-integration voltage, (ii) a feedback capacitor coupled in parallel across the amplifier, (iii) a reset switch coupled in parallel across the feedback capacitor, and (iv) a coupling capacitor coupled to an output of the amplifier and configured to receive the pre-integration voltage and generate an integration voltage. The apparatus further includes a comparator configured to compare the pre-integration voltage and a second reference voltage, where generation of the integration voltage is modifiable based on the comparison.

In a second embodiment, a system includes a focal plane array having multiple pixel circuit elements. Each pixel circuit element includes a photodetector configured to generate an electrical current based on received illumination. Each pixel circuit element also includes a CTIA unit cell having (i) an amplifier configured to receive the electrical current and a first reference voltage and generate a pre-integration voltage, (ii) a feedback capacitor coupled in parallel across the amplifier, (iii) a reset switch coupled in parallel across the feedback capacitor, and (iv) a coupling capacitor coupled to an output of the amplifier and configured to receive the pre-integration voltage and generate an integration voltage. Each pixel circuit element further includes a comparator configured to compare the pre-integration voltage and a second reference voltage, where generation of the integration voltage is modifiable based on the comparison.

In a third embodiment, a method includes generating an electrical current based on received illumination using a photodetector. The method also includes integrating the electrical current using a CTIA unit cell having (i) an amplifier configured to receive the electrical current and a first reference voltage and generate a pre-integration voltage, (ii) a feedback capacitor coupled in parallel across the amplifier, (iii) a reset switch coupled in parallel across the feedback capacitor, and (iv) a coupling capacitor coupled to an output of the amplifier and configured to receive the pre-integration voltage and generate an integration voltage. The method further includes comparing the pre-integration voltage and a second reference voltage and controlling generation of the integration voltage based on the comparison.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

Figure 1:
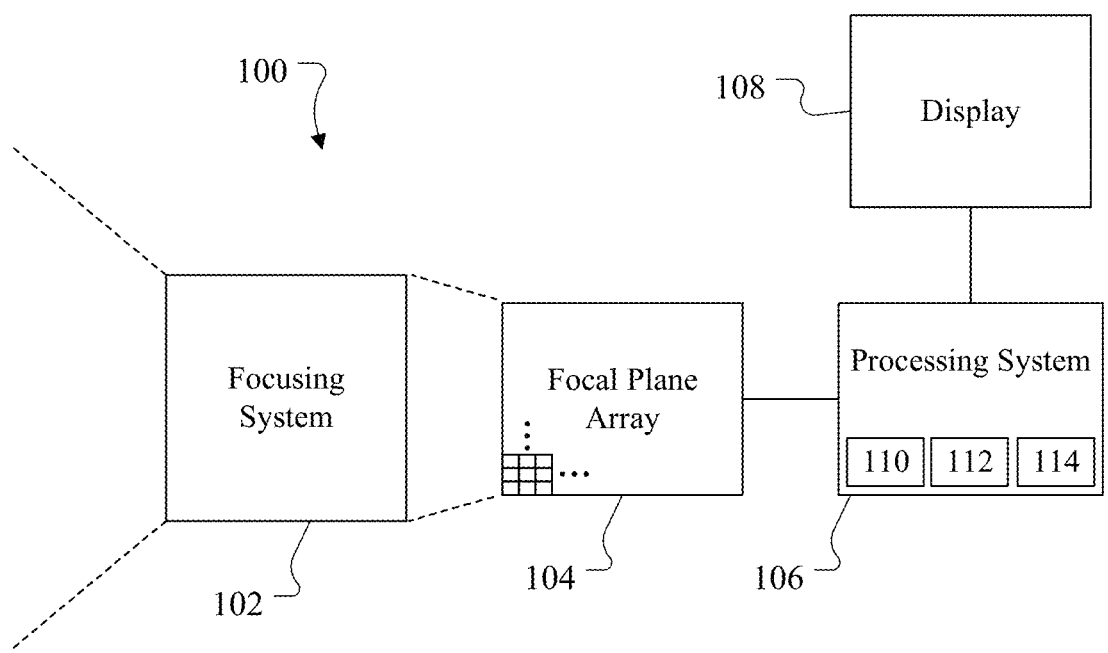
FIG. 1 illustrates an example system supporting artifact mitigation in a capacitor transimpedance amplifier (CTIA)-based imager or other imaging device according to this disclosure.

FIGS. 1 through 5, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, digital imaging systems often use integrators to capture information when generating digital images. For example, an electrical current from a pixel can be integrated during an integration period, and a generated voltage as a result of the integration can be sampled and used to generate image data for that pixel. This process can be performed for each pixel in an imaging array in order to generate image data for the array.

One issue that can affect digital imaging systems in some applications is the presence of high fluxes. If a scene being imaged includes a high flux source (such as the sun or a bright manmade light source), the high flux can cause amplifiers used in various pixel circuits to saturate. If this saturation occurs quickly before other actions occur within the pixel circuits, the pixel circuits can actually generate low outputs rather than high outputs. This leads to the creation of artifacts within captured images, such as "dark sun" or "black sun" artifacts where the sun or other light source appears as a black sun or other dark object within the captured images.

Some prior approaches attempt to use fast frame/line rates to isolate fast bright pulses to specific data samples and then filter the pulses after data has been gathered. However, these approaches may not be useful in instances where a bright light source is contained in all captured images, such as when the sun is included in a set of captured images of a scene. Other approaches may filter data generated by some pixels using data from neighboring pixels or may use different types of pixel circuits that are less sensitive. However, these approaches typically result in decreased sensitivity, which lowers the image quality of the generated images.

This disclosure provides circuits that support artifact mitigation in capacitor transimpedance amplifier (CTIA)-based imagers or other imaging devices. As described in more detail below, each of multiple pixel circuit elements in an imaging device may include a photodiode or other pixel and a CTIA unit cell that integrates an electrical current produced by the associated pixel. Each CTIA unit cell may include a transimpedance amplifier that is used to generate a pre-integration voltage, which can be stored on a capacitor in order to generate an integration voltage. The integration voltage may be buffered and provided as an output from the corresponding pixel circuit element. A clamp may include a clamp switch that can be used to selectively hold the integration voltage at a desired voltage level at specified times, such as at the beginning of an integration period. A bypass switch may be used to selectively bypass the capacitor so that the pre-integration voltage can be provided as the integration voltage.

An additional comparator in each pixel circuit element can be used to compare the pre-integration voltage to a threshold. This additional comparator can be used to sense if the CTIA unit cell saturates shortly after the integration period begins (and prior to the clamp switch opening), such as when the CTIA unit cell saturates due to high flux. When this condition is detected, the additional comparator can generate an output indicating that saturation is being detected. At that point, a feedback mechanism allows corrective action to occur in order to help mitigate the effects of the CTIA unit cell saturating. For instance, the bypass switch can be closed and the clamp switch can be opened in order to ensure that an appropriate integration voltage is generated and used to produce the output of the pixel circuit element.

In this way, the pixel circuit elements are able to dynamically adjust the integration mode being used to integrate electrical currents within the pixel circuit elements. As a result, each pixel circuit element is able to more accurately produce output values in the presence of high flux within a scene being imaged. This can help to reduce the creation of artifacts (such as "dark sun" or "black sun" artifacts) in the images of the scene. This can also help to increase the dynamic range of captured images and provide lower read noise floors for the pixel circuit elements. Further, this can be performed independently for each pixel circuit element, so pixel circuit elements that are unaffected by high flux may operate normally while pixel circuit elements affected by high flux can take action to mitigate the creation of artifacts. In addition, the mitigations of artifacts in images may be accomplished using techniques performed "on chip," meaning integrated circuit chips used to generate captured images in some embodiments can also be used to perform the described artifact mitigation techniques.

Imaging systems designed in accordance with this disclosure may be used in any suitable applications. For example, imaging systems designed in accordance with this disclosure may be used in digital cameras, video recorders, smartphones, or other electronic devices that can be used to capture still or video images. Imaging systems designed in accordance with this disclosure may be used in commercial and defense-related satellites, aircraft, and drones, such as to produce visible, infrared, or other images of scenes. Imaging systems designed in accordance with this disclosure may be used in robotic systems or other systems intended for use in surgical or industrial settings, such as to generate images of patients undergoing treatment or images of components being fabricated or processed using lasers or other electromagnetic energy. Imaging systems designed in accordance with this disclosure may be used in medical imaging systems, such as to produce images of patients in the presence of x-rays or other electromagnetic energy. In general, the imaging systems designed in accordance with this disclosure may be used in any suitable applications where high fluxes may otherwise interfere with proper operation of the imaging systems.

FIG. 1 illustrates an example system 100 supporting artifact mitigation in a capacitor transimpedance amplifier (CTIA)-based imager or other imaging device according to this disclosure. As shown in FIG. 1, the system 100 includes a focusing system 102, a focal plane array 104, and a processing system 106. The focusing system 102 generally operates to focus illumination from a scene onto the focal plane array 104. The focusing system 102 may have any suitable field of view that is directed onto the focal plane array 104. The focusing system 102 includes any suitable structure(s) configured to focus illumination, such as one or more lenses, mirrors, or other optical devices.

The focal plane array 104 generally operates to capture image data related to a scene. For example, the focal plane array 104 may include a matrix or other collection of pixel circuit elements that generate electrical signals representing a scene and that process the electrical signals. Several of the pixel circuit elements are shown in FIG. 1, although the size of the pixel circuit elements is exaggerated for convenience here. The focal plane array 104 may capture image data in any suitable spectrum or spectra, such as in the visible, infrared, or ultraviolet spectrum. The focal plane array 104 may also have any suitable resolution, such as when the focal plane array 104 includes a collection of approximately 1,000 pixel circuit elements by approximately 1,000 pixel circuit elements (although other collection sizes may be used). The focal plane array 104 includes any suitable collection of pixel circuit elements configured to capture image data. The focal plane array 104 may also include additional components that facilitate the receipt and output of information, such as readout integrated circuits (ROICs).

As described in more detail below, the pixel circuit elements of the focal plane array 104 include pixels (such as photodiodes) that capture illumination from a scene and generate electrical currents. For each pixel circuit element, the electrical current of the associated pixel can be integrated using a CTIA unit cell in order to generate a pre-integration voltage, which can be stored on a capacitor in order to generate an integration voltage. Each pixel circuit element of the focal plane array 104 may also include an additional comparator that compares the associated pre-integration voltage to a threshold, which can be done to identify the presence of high flux in the scene. The output of the additional comparator can be used to control how the pixel circuit element generates the integration voltage in order to compensate for the presence of the high flux in the scene, thereby helping to mitigate the effects of the high flux.

The processing system 106 receives outputs from the focal plane array 104 and processes the information. For example, the processing system 106 may process image data generated by the focal plane array 104 in order to generate visual images for presentation to one or more personnel, such as on a display 108. However, the processing system 106 may use the image data generated by the focal plane array 104 in any other suitable manner. The processing system 106 includes any suitable structure configured to process information from a focal plane array or other imaging system. For instance, the processing system 106 may include one or more processing devices 110, such as one or more microprocessors, microcontrollers, digital signal processors, field programmable gate arrays, application specific integrated circuits, or discrete logic devices. The processing system 106 may also include one or more memories 112, such as a random access memory, read only memory, hard drive, Flash memory, optical disc, or other suitable volatile or non-volatile storage device(s). The processing system 106 may further include one or more interfaces 114 that support communications with other systems or devices, such as a network interface card or a wireless transceiver facilitating communications over a wired or wireless network or a direct connection. The display 108 includes any suitable device configured to graphically present information.

Although FIG. 1 illustrates one example of a system 100 supporting artifact mitigation in a CTIA-based imager or other imaging device, various changes may be made to FIG. 1. For example, various components in FIG. 1 may be combined, further subdivided, replicated, omitted, or rearranged and additional components may be added according to particular needs. Also, FIG. 1 illustrates one example type of system in which artifact mitigation for an imaging device may be used. However, the functionality for artifact mitigation may be used in any other suitable device or system.

Figure 2:
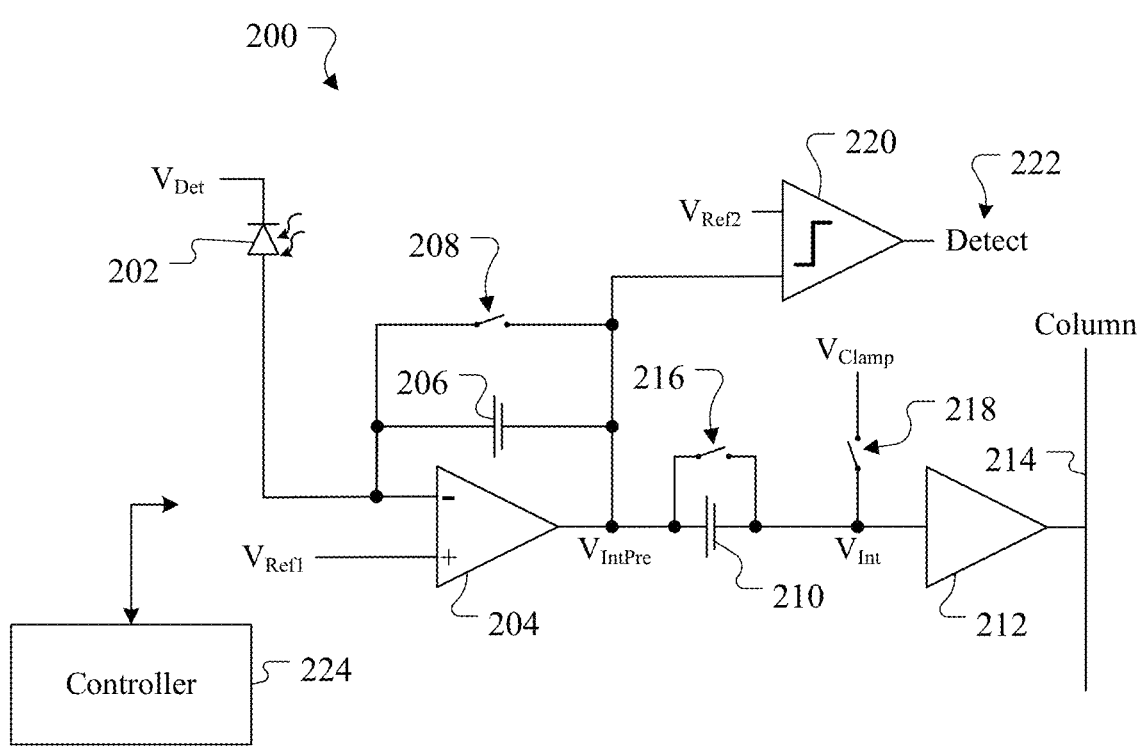
FIG. 2 illustrates an example circuit supporting artifact mitigation in a CTIA-based imager or other imaging device according to this disclosure.

FIG. 2 illustrates an example circuit 200 supporting artifact mitigation in a CTIA-based imager or other imaging device according to this disclosure. An instance of the circuit 200 shown in FIG. 2 may, for example, represent (or be used as at least part of) each pixel circuit element of the focal plane array 104 in the system 100 shown in FIG. 1. Thus, different pixel circuit elements of the focal plane array 104 may include different instances of the circuit 200 shown in FIG. 2. However, any number of the circuits 200 may be used with any other suitable device and in any other suitable system.

As shown in FIG. 2, the circuit 200 includes a pixel in the form of a photodetector 202, which generally operates to produce an electrical current based on received illumination. The photodetector 202 includes any suitable structure configured to generate an electrical current based on received illumination, such as a photodiode. In some cases, the photodetector 202 may represent a photodiode or other structure that can sense illumination in a specified wavelength range or band, such as in the visible, infrared, or ultraviolet spectrum. The photodetector 202 here is coupled to receive a detector voltage $V_{Det}$, which may be provided by any suitable voltage source.

The electrical current generated by the photodetector 202 is provided to an amplifier 204, and a feedback capacitor 206 and a reset switch 208 are coupled in parallel across the amplifier 204 (meaning the feedback capacitor 206 and the reset switch 208 are each coupled to the input and the output of the amplifier 204). The amplifier 204 in this example is arranged as an inverting amplifier that receives the electrical current generated by the photodetector 202 on an inverting input terminal and that receives a first reference voltage $V_{Ref1}$ (which may be provided by any suitable voltage source) on a non-inverting input terminal. An output generated by the amplifier 204 can be proportional to a product of the electrical current generated by the photodetector 202 and the integration or sampling time and can be inversely proportional to the value of the feedback capacitor 206. The output from the amplifier 204 here is used to charge the feedback capacitor 206. The reset switch 208 can be closed prior to an integration period in order to reset the voltage stored on the feedback capacitor 206, and the reset switch 208 can be opened at the beginning of an integration period in order to allow the feedback capacitor 206 to be charged during the integration period. The output of the amplifier 204 represents a pre-integration voltage $V_{IntPre}$, which can be used to charge a coupling capacitor 210 and generate an integration voltage $V_{Int}$. Effectively, these components form a CTIA unit cell that converts the electrical current generated by the photodetector 202 into a corresponding voltage during each of one or more integration periods.

The integration voltage $V_{Int}$ may be buffered using a buffer 212 and provided as an output from the corresponding pixel circuit element. In this example, the pixel circuit element may be coupled to a column line 214, which represents an electrical conductor that can be coupled to multiple pixel circuit elements and a readout integrated circuit or other component. Multiplexing or other circuitry can be used to enable outputs from the multiple pixel circuit elements to be obtained over the column line 214. The focal plane array 104 may include any suitable number of column lines 214, each of which may be coupled to any suitable number of pixel circuit elements. Note, however, that the use of column lines 214 is optional, and outputs of the pixel circuit elements may be obtained in any other suitable manner.

A bypass switch 216 is coupled in parallel across the coupling capacitor 210 and can be used to selectively bypass the coupling capacitor 210. For example, during non-high flux operation, the bypass switch 216 can be opened, and the pre-integration voltage $V_{IntPre}$ is provided to the coupling capacitor 210 for use in generating the integration voltage $V_{Int}$. During high flux operation, the bypass switch 216 can be closed, and the pre-integration voltage $V_{IntPre}$ bypasses the coupling capacitor 210 and is provided as the integration voltage $V_{Int}$. As described below, this can be done to help mitigate the creation of artifacts in captured images caused by high fluxes.

A clamp can also be used to selectively hold the integration voltage $V_{Int}$ at a desired voltage level at specified times, such as at the beginning of an integration period. The clamp here is formed using a clamp switch 218 that can be used to selectively couple the coupling capacitor 210 and the buffer 212 to a clamp voltage $V_{Clamp}$ (which may be provided by any suitable voltage source). As described below, the clamp switch 218 can be closed in order to hold the integration voltage $V_{Int}$ at a desired voltage level at the start of an integration period and then opened to allow for integration of the electrical current from the photodetector 202 during the integration period.

The CTIA unit cell shown in FIG. 2 can be used to generate very accurate image data for a scene. In some cases, for instance, the amplifier 204 may use a bias current of only a few nano-amps so that the CTIA unit cell can minimize power while detecting very low electrical currents from the photodetector 202. However, the CTIA unit cell can saturate quickly when the photodetector 202 provides a large electrical current due to high flux. Such a large electrical current can prevent the CTIA unit cell from accurately measuring small changes in the electrical current. If the saturation occurs very quickly at the start of an integration period (before the clamp switch 218 opens), it is possible for the pixel circuit element to produce an incorrect low output signal indicative of low flux, rather than a correct high output signal indicative of high flux. In some cases, this can create a "dark sun" or "black sun" artifact since the resulting image includes dark pixels where very bright pixels should be included.

To help compensate for this type of issue, the circuit 200 here includes a comparator 220 that is coupled to the output of the amplifier 204. The comparator 220 receives the pre-integration voltage $V_{IntPre}$ and compares the pre-integration voltage $V_{IntPre}$ to a second reference voltage $V_{Ref2}$ (which may be provided by any suitable voltage source). The second reference voltage $V_{Ref2}$ can represent a different voltage than the first reference voltage $V_{Ref1}$. When the comparator 220 determines that the pre-integration voltage $V_{IntPre}$ equals or crosses the second reference voltage $V_{Ref2}$, this is indicative of the CTIA unit cell saturating, and the comparator 220 can generate a pulse or other detection signal 222. The detection signal 222 indicates that the CTIA unit cell is saturating, which allows a controller 224 to take corrective action. In some embodiments, the second reference voltage $V_{Ref2}$ may represent a relatively-low voltage level, and the comparator 220 may detect when the pre-integration voltage $V_{IntPre}$ equals or falls below the second reference voltage $V_{Ref2}$.

The controller 224 may be used to control the operations of various components in the circuit 200. For example, the controller 224 may be used to generate drive signals for controlling the states of the various switches 208, 216, 218 in the circuit 200. The controller 224 can also use various inputs (such as the detection signal 222) when controlling the states of the various switches 208, 216, 218 in the circuit 200. Thus, for instance, during non-high flux operation of the circuit 200, the controller 224 may keep the bypass switch 216 opened so that there is no bypass around the coupling capacitor 210. The controller 224 can close the switches 208 and 218 to reset the CTIA unit cell, and the controller 224 can open the reset switch 208 at the beginning of an integration period. Shortly after the beginning of the integration period, the controller 224 can open the clamp switch 218 and allow the integration voltage $V_{Int}$ to be generated and used to produce an output of the circuit 200. The controller 224 can close the switches 208 and 218 to reset the CTIA unit cell again, and the controller 224 can open the reset switch 208 at the beginning of the next integration period and repeat the same process.

During high flux operation of the circuit 200, the controller 224 may initially have the bypass switch 216 opened so that there is no bypass around the coupling capacitor 210. The controller 224 can close the switches 208 and 218 to reset the CTIA unit cell, and the controller 224 can open the reset switch 208 at the beginning of an integration period. However, prior to the normal opening of the clamp switch 218, the comparator 220 may determine that the CTIA unit cell is saturating based on the pre-integration voltage $V_{IntPre}$ and the second reference voltage $V_{Ref2}$, and the controller 224 (based on the resulting detection signal 222) can open the clamp switch 218 and close the bypass switch 216 to provide the bypass around the coupling capacitor 210. As a result, the pre-integration voltage $V_{IntPre}$ can be used as the integration voltage $V_{Int}$ when generating an output from the circuit 200, which allows the saturation voltage level to be applied as the integration voltage $V_{Int}$ during this time.

Effectively, the detection signal 222 is being used to support a feedback mechanism that allows corrective action to be taken when rapid saturation of the CTIA unit cell is detected. Note that this can be done during integration after an integration period has begun and before or coincident with the clamp switch 218 being opened (and before imaging has occurred). This can help to mitigate the effects of the CTIA unit cell saturating and reduce the likelihood of creating "dark sun" or "black sun" artifacts in a captured image.

The amplifier 204 includes any suitable structure configured to generate an amplified output based on an input electrical current. Each capacitor 206, 210 includes any suitable capacitive structure having any suitable capacitance. Each switch 208, 216, 218 includes any suitable structure configured to selectively form and break an electrical connection, such as a transistor. The buffer 212 includes any suitable structure configured to receive and output an electrical voltage. The comparator 220 includes any suitable structure configured to receive and compare multiple electrical voltages. The controller 224 includes any suitable structure configured to control operation of one or more components of the circuit 200. For example, the controller 224 may represent at least one microprocessor, microcontroller, digital signal processor (DSP), field programmable gate array (FPGA), application-specific integrated circuit (ASIC), logic gates, or discrete circuitry. Note that the same controller 224 may or may not be used to control components in different or all instances of the circuit 200.

Although FIG. 2 illustrates one example of a circuit 200 supporting artifact mitigation in a CTIA-based imager or other imaging device, various changes may be made to FIG. 2. For example, any additional components may be used with the circuit 200 to support other desired functions.

Figure 3A:
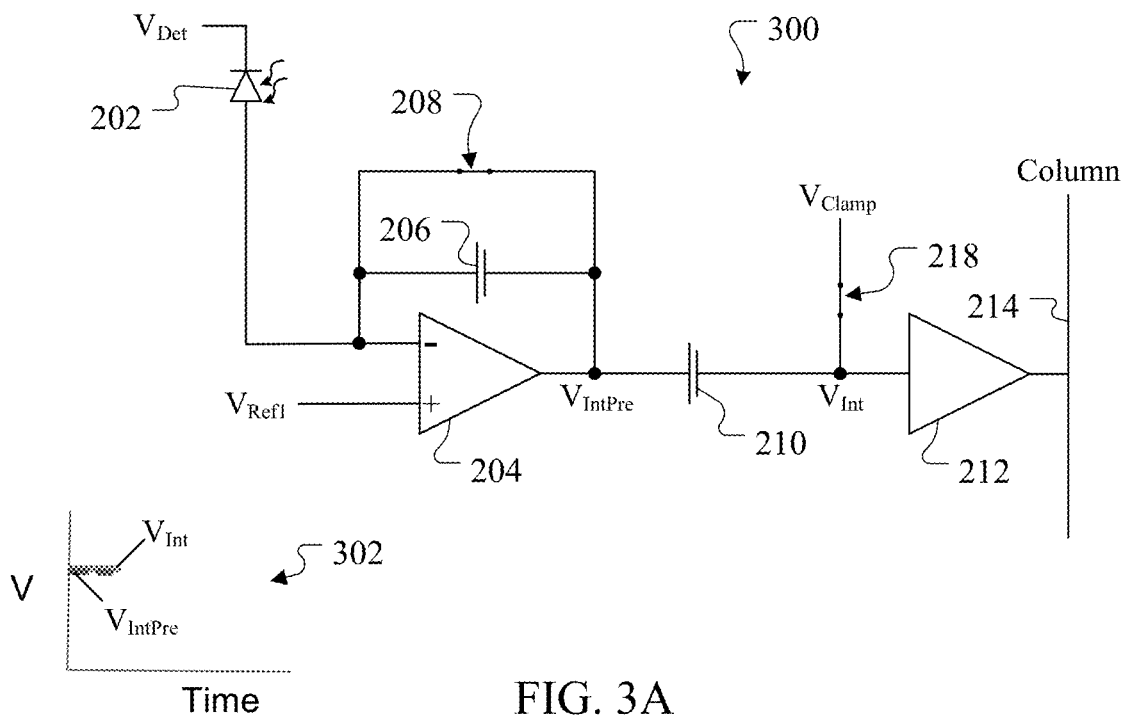
FIGS. 3A through 3D illustrate example operations of a circuit without artifact mitigation according to this disclosure.

FIGS. 3A through 3D illustrate example operations of a circuit 300 without artifact mitigation according to this disclosure. In particular, FIGS. 3A through 3D illustrate example operations of a circuit 300 similar to the circuit 200 but without the bypass switch 216 and the comparator 220. In FIG. 3A, the circuit 300 is being reset, so the switches 208 and 218 are closed. This resets the CTIA unit cell and clamps the integration voltage $V_{Int}$ to the clamp voltage $V_{Clamp}$. This also causes the pre-integration voltage $V_{IntPre}$ and the integration voltage $V_{Int}$ to achieve substantially equal values as shown in a plot 302.

Figure 3B:
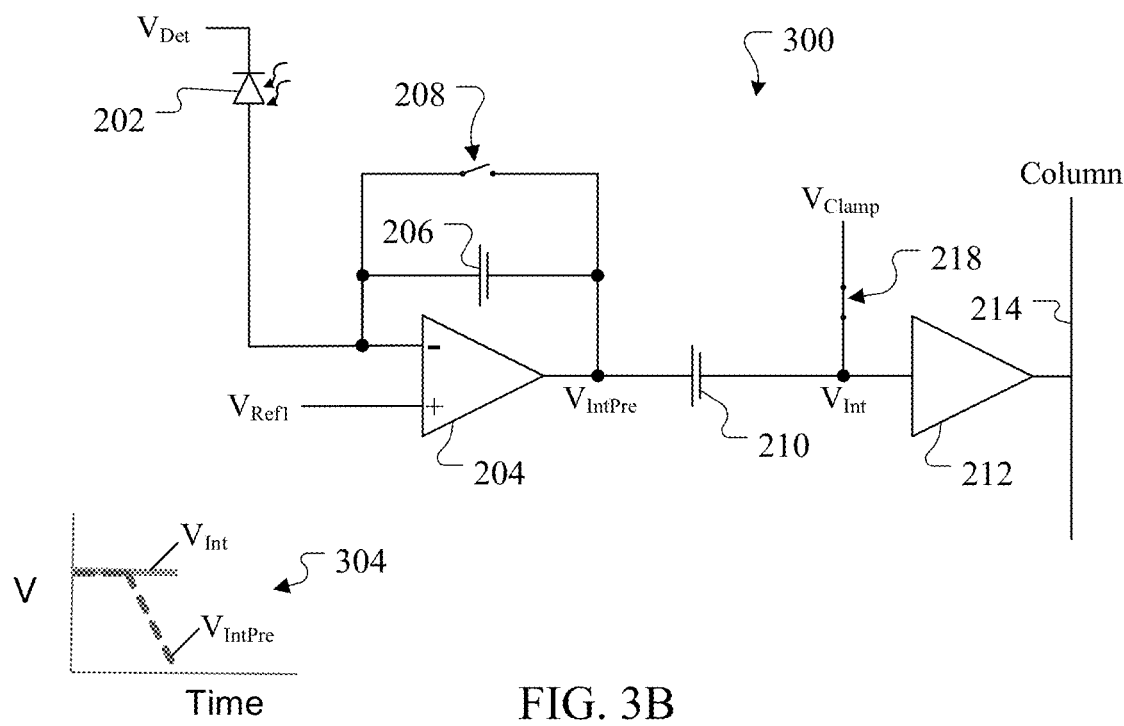

In FIG. 3B, the reset of the circuit 300 is released, so the reset switch 208 is opened, which may occur at the beginning of an integration period. The clamp switch 218 can remain closed at this point. In this configuration, under a high flux condition, the CTIA unit cell quickly saturates. As a result, the pre-integration voltage $V_{IntPre}$ drops due to current from the photodetector 202, while the integration voltage $V_{Int}$ can remain clamped to the clamp voltage $V_{Clamp}$ as shown in a plot 304.

Figure 3C:
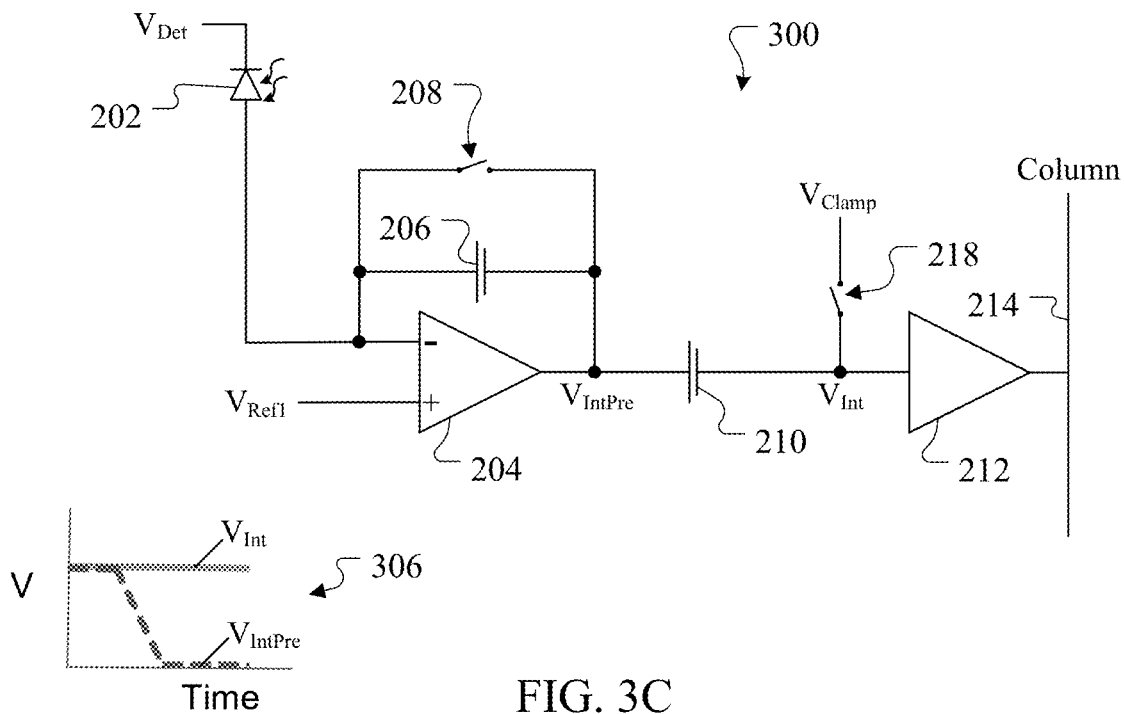
Figure 3D:
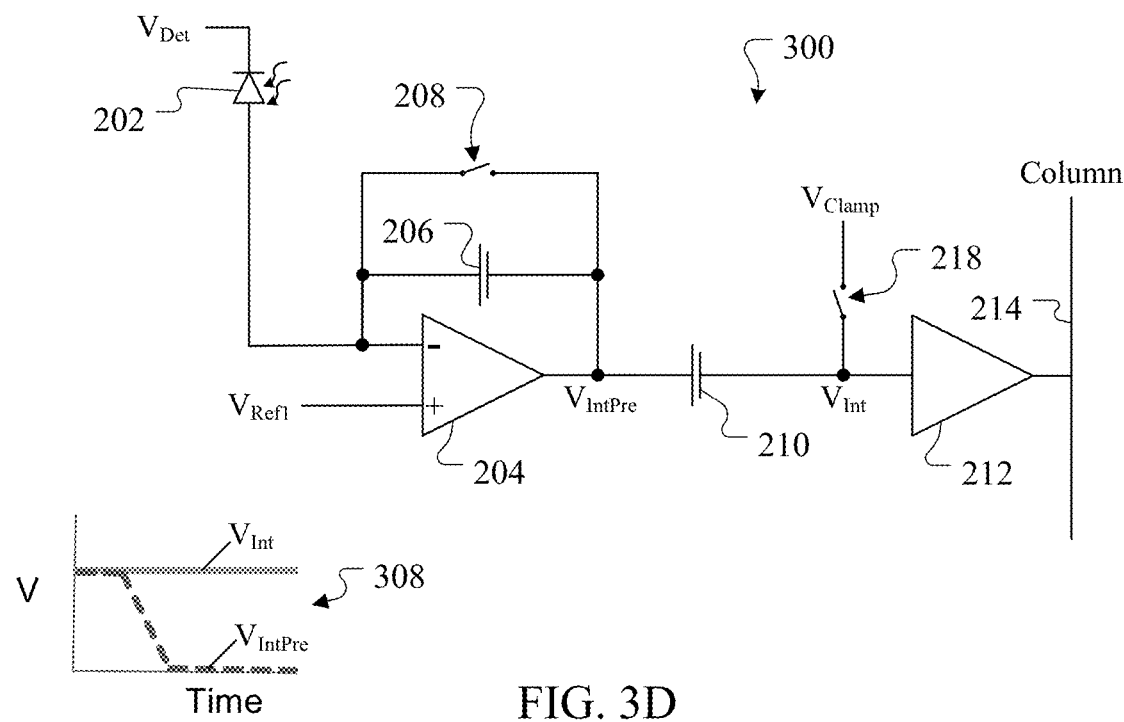

In FIG. 3C, the clamp is released, so the clamp switch 218 is opened. In this configuration, under the high flux condition, the CTIA unit cell has already saturated, so the coupling capacitor 210 will not integrate any further. The result here is that the pre-integration voltage $V_{IntPre}$ levels off at a low voltage level, while the integration voltage $V_{Int}$ remains at a high voltage level as shown in a plot 306. This can continue over time as shown in a plot 308 in FIG. 3D. When the output of the circuit 300 is generated, the integration voltage $V_{Int}$ causes a low light level to be identified, even though a high light level should have been identified due to the high flux condition.

Figure 4A:
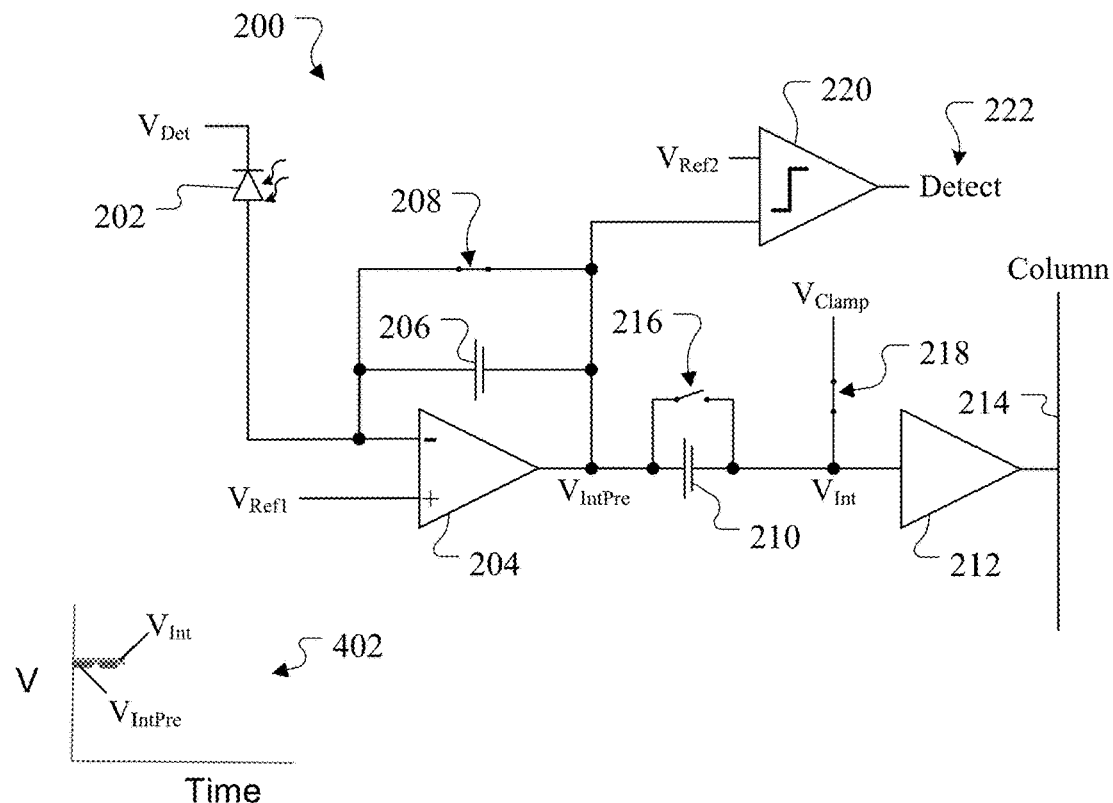
FIGS. 4A through 4D illustrate example operations of the circuit of FIG. 2 with artifact mitigation according to this disclosure.

FIGS. 4A through 4D illustrate example operations of the circuit 200 of FIG. 2 with artifact mitigation according to this disclosure. In FIG. 4A, the circuit 200 is being reset, so the switches 208 and 218 are closed. A high flux condition has not yet been detected, and the bypass switch 216 is opened. This resets the CTIA unit cell and clamps the integration voltage $V_{Int}$ to the clamp voltage $V_{Clamp}$. This also causes the pre-integration voltage $V_{IntPre}$ and the integration voltage $V_{Int}$ to achieve substantially equal values as shown in a plot 402.

Figure 4B:
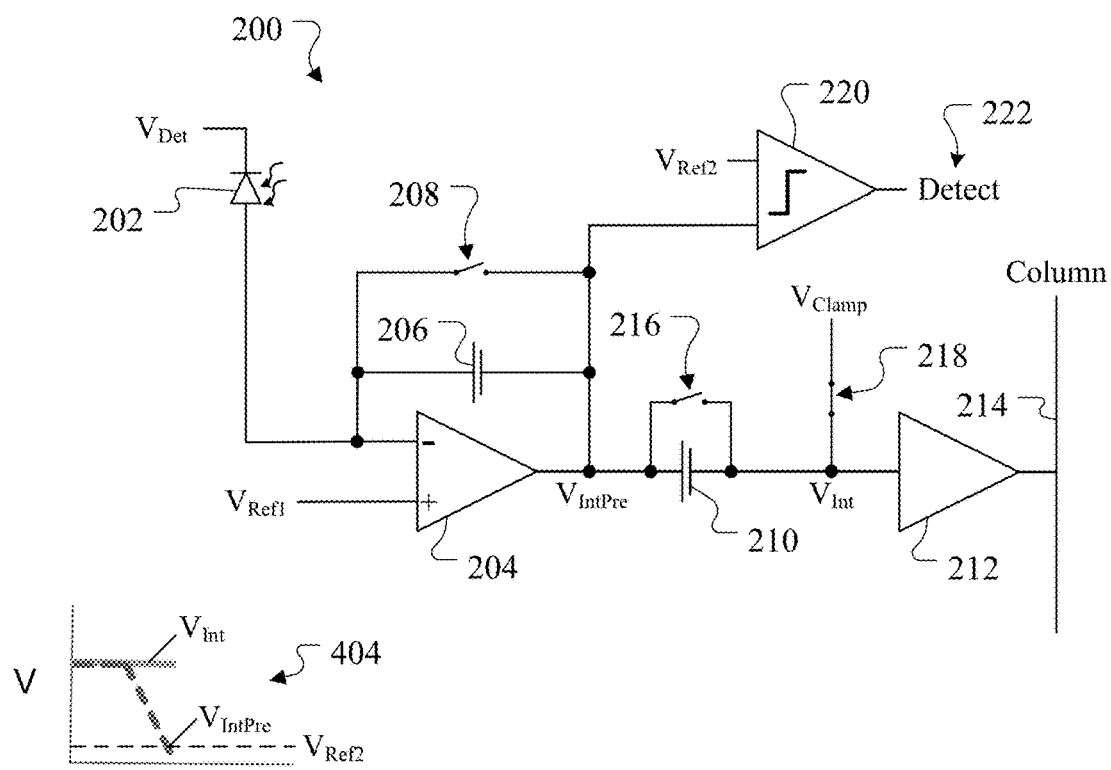

In FIG. 4B, the reset of the circuit 200 is released, so the reset switch 208 is opened, which may occur at the beginning of an integration period. The clamp switch 218 can remain closed, and the bypass switch 216 can remain opened. In this configuration, under a high flux condition, the CTIA unit cell quickly saturates. As a result, the pre-integration voltage $V_{IntPre}$ drops due to current from the photodetector 202, while the integration voltage $V_{Int}$ can remain clamped to the clamp voltage $V_{Clamp}$ as shown in a plot 404. In the plot 404, the second reference voltage $V_{Ref2}$ is shown, and it can be seen that the pre-integration voltage $V_{IntPre}$ drops to or below the second reference voltage $V_{Ref2}$ here.

Figure 4C:
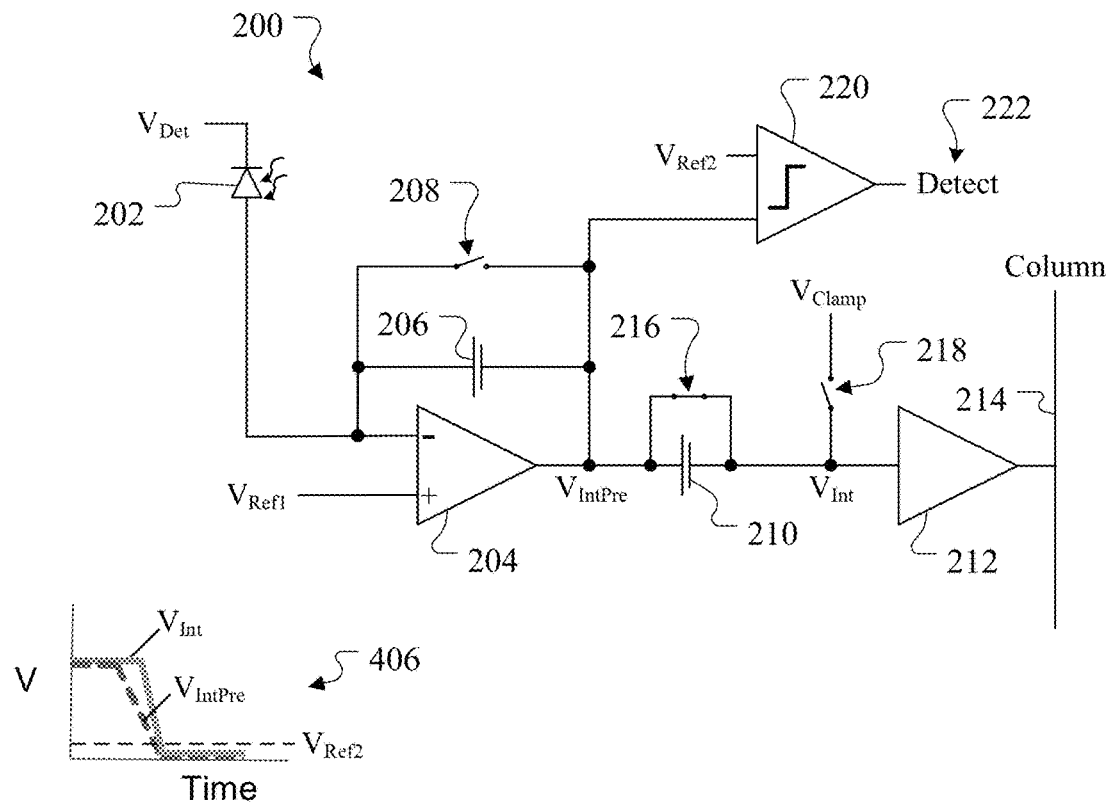
Figure 4D:
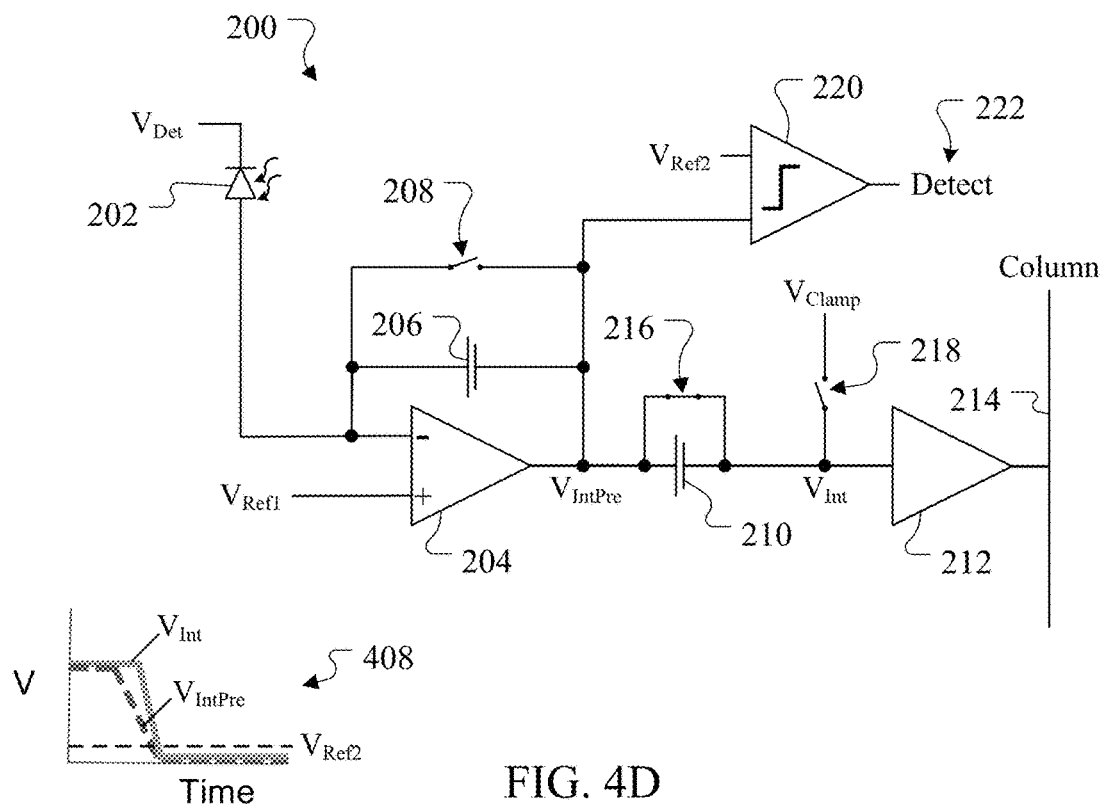

In FIG. 4C, the comparator 220 detects the high flux condition by sensing the saturation of the CTIA unit cell since the pre-integration voltage $V_{IntPre}$ equals or drops below the second reference voltage $V_{Ref2}$. As a result, the comparator 220 generates the detection signal 222 to indicate the saturation condition of the CTIA unit cell. In response to the detection signal 222, the bypass switch 216 is closed, and the clamp switch 218 is opened. This causes the integration voltage $V_{Int}$ to rapidly change and become substantially equal to the pre-integration voltage $V_{IntPre}$ as shown in a plot 406. This can continue over time as shown in a plot 408 in FIG. 4D. When the output of the circuit 200 is generated, the integration voltage $V_{Int}$ causes a high light level to be identified, which is more consistent with the presence of the high flux condition.

Although FIGS. 3A through 3D illustrate one example of operations of a circuit 300 without artifact mitigation and FIGS. 4A through 4D illustrate one example of operations of the circuit 200 of FIG. 2 with artifact mitigation, various changes may be made to FIGS. 3A through 4D. For example, while the plots 302-308, 402-408 may appear to indicate that the integration voltage $V_{Int}$ is slightly higher than the pre-integration voltage $V_{IntPre}$ at various times, this is done merely to provide adequate separation between lines in the plots 302-308, 402-408 so that different lines can be distinguished in the plots 302-308, 402-408.

Figure 5:
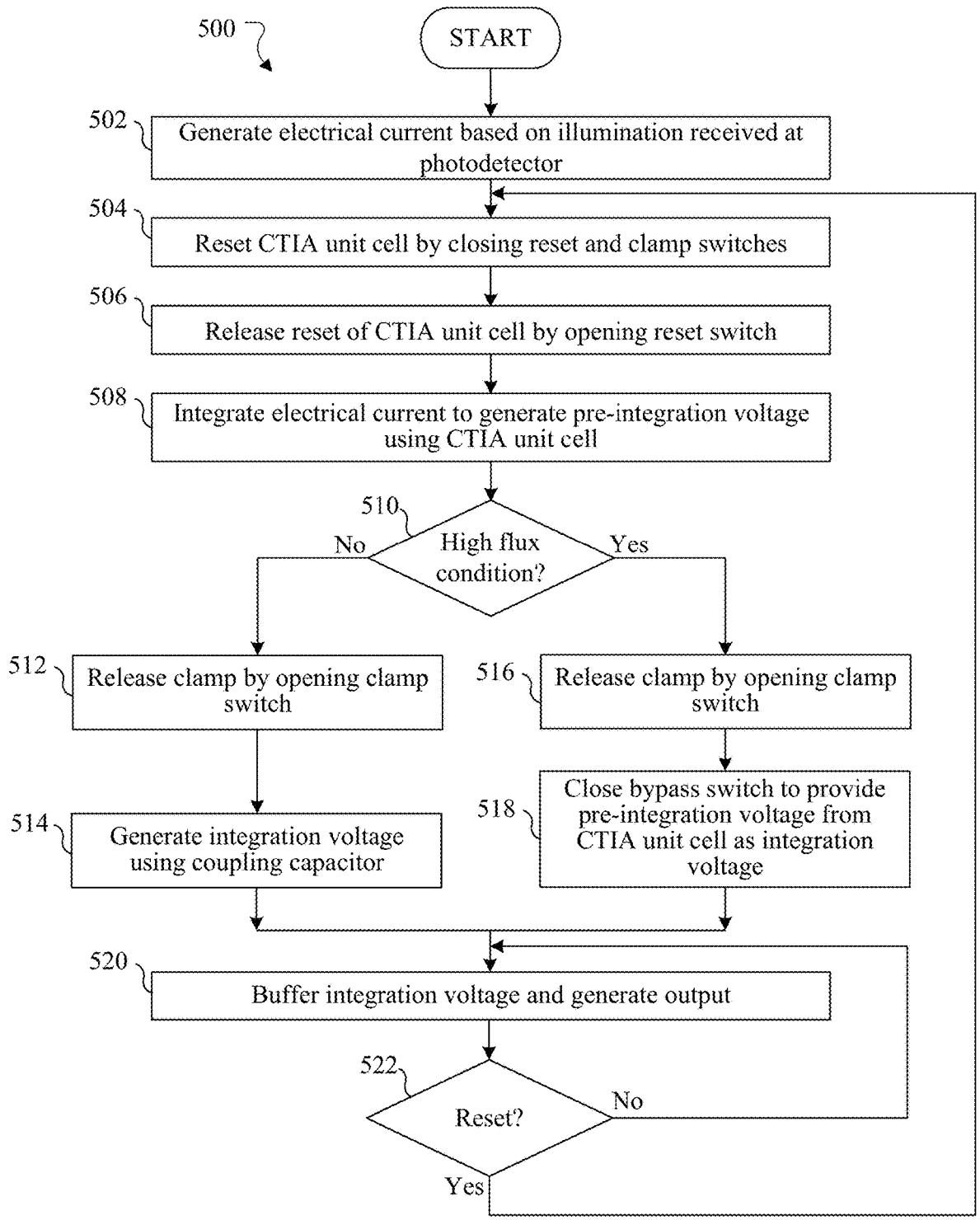
FIG. 5 illustrates an example method for artifact mitigation in a CTIA-based imager or other imaging device according to this disclosure.

FIG. 5 illustrates an example method 500 for artifact mitigation in a CTIA-based imager or other imaging device according to this disclosure. For ease of explanation, the method 500 is described as being performed using the circuit 200 of FIG. 2 in the system 100 of FIG. 1. However, the method 500 may be performed using any other suitable circuit and in any other suitable system.

As shown in FIG. 5, an electrical current is generated based on illumination received at a photodetector at step 502. This may include, for example, the photodetector 202 generating an electrical current based on received illumination. A CTIA unit cell that receives the electrical current is reset at step 504. This may include, for example, the controller 224 closing the reset switch 208 and the clamp switch 218 in the circuit 200. Closing the reset switch 208 resets the voltage on the capacitor 206 of the CTIA unit cell, and closing the clamp switch 218 clamps the integration voltage $V_{Int}$ to the clamp voltage $V_{Clamp}$.

The reset of the CTIA unit cell is released at step 506, and the CTIA unit cell begins integrating the electrical current to generate a pre-integration voltage at step 508. This may include, for example, the controller 224 opening the reset switch 208 so that the amplifier 204 of the CTIA unit cell can generate the pre-integration voltage $V_{IntPre}$ based on the electrical current from the photodetector 202. The release of the reset may, for instance, occur at the beginning of an integration period. At this point, the clamp switch 218 is still closed, thereby clamping the integration voltage $V_{Int}$ to the clamp voltage $V_{Clamp}$.

If there is no high flux condition at step 510, the clamp is released at step 512, and an integration voltage is generated using a coupling capacitor at step 514. This may include, for example, the comparator 220 comparing the pre-integration voltage $V_{IntPre}$ and the reference voltage $V_{Ref2}$ and determining that no high flux condition is present based on the comparison. This may also include the controller 224 opening the clamp switch 218 so that the integration voltage $V_{Int}$ is no longer clamped to the clamp voltage $V_{Clamp}$. This may further include the pre-integration voltage $V_{IntPre}$ being provided to the coupling capacitor 210 for use in generating the integration voltage $V_{Int}$. The integration voltage can be buffered and used to generate an output of the circuit at step 520. This may include, for example, the buffer 212 buffering the integration voltage $V_{Int}$ generated using the coupling capacitor 210. This may also include the buffer 212 outputting the buffered signal over the column line 214 or in any other suitable manner.

If there is a high flux condition at step 510, a bypass switch is closed at step 516, and the clamp is released at step 518. This may include, for example, the comparator 220 comparing the pre-integration voltage $V_{IntPre}$ and the reference voltage $V_{Ref2}$ and determining that a high flux condition is present based on the comparison. This may also include the controller 224 closing the bypass switch 216 (which is coupled in parallel with the coupling capacitor 210) so that the pre-integration voltage $V_{IntPre}$ is provided as the integration voltage $V_{Int}$. This may further include the controller 224 opening the clamp switch 218 so that the integration voltage $V_{Int}$ (which represents the pre-integration voltage $V_{IntPre}$) is no longer clamped to the clamp voltage $V_{Clamp}$. The integration voltage can be buffered and used to generate the output of the circuit at step 520. This may include, for example, the buffer 212 buffering the integration voltage $V_{Int}$ and outputting the buffered signal over the column line 214 or in any other suitable manner.

A determination is made whether the CTIA unit cell should be reset at step 522. This may include, for example, the controller 224 determining whether the end of the integration period has been reached or whether some other criterion or criteria have been satisfied. If not, the process can continue by buffering the integration voltage $V_{Int}$ that is being generated by the CTIA unit cell. Otherwise, the process can return to step 504 in order to reset the CTIA unit cell.

Although FIG. 5 illustrates one example of a method 500 for artifact mitigation in a CTIA-based imager or other imaging device, various changes may be made to FIG. 5. For example, while shown as a series of steps, various steps in FIG. 5 may overlap, occur in parallel, occur in a different order, or occur any number of times (including zero times).

The following describes example embodiments of this disclosure that implement or relate to artifact mitigation in CTIA-based imagers or other imaging devices. However, other embodiments may be used in accordance with the teachings of this disclosure.

In a first embodiment, an apparatus includes a photodetector configured to generate an electrical current based on received illumination. The apparatus also includes a CTIA unit cell having (i) an amplifier configured to receive the electrical current and a first reference voltage and generate a pre-integration voltage, (ii) a feedback capacitor coupled in parallel across the amplifier, (iii) a reset switch coupled in parallel across the feedback capacitor, and (iv) a coupling capacitor coupled to an output of the amplifier and configured to receive the pre-integration voltage and generate an integration voltage. The apparatus further includes a comparator configured to compare the pre-integration voltage and a second reference voltage, where generation of the integration voltage is modifiable based on the comparison.

Any single one or any suitable combination of the following features may be used with the first embodiment. The apparatus may further include a bypass switch coupled in parallel with the coupling capacitor and a clamp switch configured to clamp the integration voltage to a specified voltage. The reset and clamp switches may be configured to be closed to reset the CTIA unit cell, and the reset switch may be configured to be opened at a beginning of an integration period. When no high flux condition is detected by the comparator based on the comparison, the clamp switch may be configured to be opened after the beginning of the integration period, and the bypass switch may be configured to remain opened during the integration period. When a high flux condition is detected by the comparator based on the comparison, the bypass switch may be configured to be closed in order to provide the pre-integration voltage as the integration voltage, and the clamp switch may be configured to be opened so that the integration voltage is not clamped to the specified voltage. The amplifier may be configured to receive the electrical current on an inverting input terminal and the first reference voltage on a non-inverting input terminal, and the inverting input terminal may be coupled to an output of the photodetector. The comparator and the bypass switch may be coupled to an output of the amplifier. The comparator may be configured to generate a detection signal in response to detecting a high flux condition based on the comparison. The apparatus may further include a controller configured to control operation of the bypass and clamp switches based on the detection signal in order to modify the generation of the integration voltage. The apparatus may further include a buffer configured to receive the integration voltage and generate an output signal.

In a second embodiment, a system includes a focal plane array having multiple pixel circuit elements. Each pixel circuit element includes a photodetector configured to generate an electrical current based on received illumination. Each pixel circuit element also includes a CTIA unit cell having (i) an amplifier configured to receive the electrical current and a first reference voltage and generate a pre-integration voltage, (ii) a feedback capacitor coupled in parallel across the amplifier, (iii) a reset switch coupled in parallel across the feedback capacitor, and (iv) a coupling capacitor coupled to an output of the amplifier and configured to receive the pre-integration voltage and generate an integration voltage. Each pixel circuit element further includes a comparator configured to compare the pre-integration voltage and a second reference voltage, where generation of the integration voltage is modifiable based on the comparison.

Any single one or any suitable combination of the following features may be used with the second embodiment. Each pixel circuit element may further include a bypass switch coupled in parallel with the coupling capacitor and a clamp switch configured to clamp the integration voltage to a specified voltage. In each pixel circuit element, the reset and clamp switches may be configured to be closed to reset the CTIA unit cell, and the reset switch may be configured to be opened at a beginning of an integration period. In each pixel circuit element, when no high flux condition is detected by the comparator based on the comparison, the clamp switch may be configured to be opened after the beginning of the integration period, and the bypass switch may be configured to remain opened during the integration period. In each pixel circuit element, when a high flux condition is detected by the comparator based on the comparison, the bypass switch may be configured to be closed in order to provide the pre-integration voltage as the integration voltage, and the clamp switch may be configured to be opened so that the integration voltage is not clamped to the specified voltage. In each pixel circuit element, the amplifier may be configured to receive the electrical current on an inverting input terminal and the first reference voltage on a non-inverting input terminal, the inverting input terminal may be coupled to an output of the photodetector, and the comparator and the bypass switch may be coupled to an output of the amplifier. In each pixel circuit element, the comparator may be configured to generate a detection signal in response to detecting a high flux condition based on the comparison. The system may further include at least one controller configured to control operation of the bypass and clamp switches in each pixel circuit element based on the detection signal in order to modify the generation of the integration voltage. Each pixel circuit element may further include a buffer configured to receive the integration voltage and generate an output signal. The system may further include a data processing system configured to process output signals from the focal plane array and generate one or more images of a scene.

In a third embodiment, a method includes generating an electrical current based on received illumination using a photodetector. The method also includes integrating the electrical current using a CTIA unit cell having (i) an amplifier configured to receive the electrical current and a first reference voltage and generate a pre-integration voltage, (ii) a feedback capacitor coupled in parallel across the amplifier, (iii) a reset switch coupled in parallel across the feedback capacitor, and (iv) a coupling capacitor coupled to an output of the amplifier and configured to receive the pre-integration voltage and generate an integration voltage. The method further includes comparing the pre-integration voltage and a second reference voltage and controlling generation of the integration voltage based on the comparison.

Any single one or any suitable combination of the following features may be used with the third embodiment. A bypass switch may be coupled in parallel with the coupling capacitor, and a clamp switch may be configured to clamp the integration voltage to a specified voltage. Controlling the generation of the integration voltage may include controlling operation of the bypass and clamp switches based on the comparison. The reset and clamp switches may be closed to reset the CTIA unit cell, and the reset switch may be opened at a beginning of an integration period. When no high flux condition is detected based on the comparison, (i) the clamp switch may be opened after the beginning of the integration period and (ii) the bypass switch may remain opened during the integration period. When a high flux condition is detected based on the comparison, (i) the bypass switch may be closed in order to provide the pre-integration voltage as the integration voltage and (ii) the clamp switch may be opened so that the integration voltage is not clamped to the specified voltage.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
   a photodetector configured to generate an electrical current based on received illumination;
   a capacitor transimpedance amplifier (CTIA) unit cell comprising (i) an amplifier configured to receive the electrical current and a first reference voltage and generate a pre-integration voltage, (ii) a feedback capacitor coupled in parallel across the amplifier, (iii) a reset switch coupled in parallel across the feedback capacitor, and (iv) a coupling capacitor coupled to an output of the amplifier and configured to receive the pre-integration voltage and generate an integration voltage;
   a comparator configured to compare the pre-integration voltage and a second reference voltage, wherein generation of the integration voltage is modifiable based on the comparison;
   a bypass switch coupled in parallel with the coupling capacitor; and
   a clamp switch configured to clamp the integration voltage to a specified voltage.

2. The apparatus of claim 1, wherein:
   the reset and clamp switches are configured to be closed to reset the CTIA unit cell; and
   the reset switch is configured to be opened at a beginning of an integration period.

3. The apparatus of claim 2, wherein, when no high flux condition is detected by the comparator based on the comparison:
   the clamp switch is configured to be opened after the beginning of the integration period; and
   the bypass switch is configured to remain opened during the integration period.

4. The apparatus of claim 2, wherein, when a high flux condition is detected by the comparator based on the comparison:
   the bypass switch is configured to be closed in order to provide the pre-integration voltage as the integration voltage; and
   the clamp switch is configured to be opened so that the integration voltage is not clamped to the specified voltage.

5. The apparatus of claim 1, wherein:
   the amplifier is configured to receive the electrical current on an inverting input terminal and the first reference voltage on a non-inverting input terminal, the inverting input terminal coupled to an output of the photodetector; and
   the comparator and the bypass switch are coupled to an output of the amplifier.

6. The apparatus of claim 1, wherein:
   the comparator is configured to generate a detection signal in response to detecting a high flux condition based on the comparison; and
   the apparatus further comprises a controller configured to control operation of the bypass and clamp switches based on the detection signal in order to modify the generation of the integration voltage.

7. The apparatus of claim 1, further comprising:
   a buffer configured to receive the integration voltage and generate an output signal.

8. A system comprising:
   a focal plane array comprising multiple pixel circuit elements;
   wherein each pixel circuit element comprises:
      a photodetector configured to generate an electrical current based on received illumination;
      a capacitor transimpedance amplifier (CTIA) unit cell comprising (i) an amplifier configured to receive the electrical current and a first reference voltage and generate a pre-integration voltage, (ii) a feedback capacitor coupled in parallel across the amplifier, (iii) a reset switch coupled in parallel across the feedback capacitor, and (iv) a coupling capacitor coupled to an output of the amplifier and configured to receive the pre-integration voltage and generate an integration voltage;

a comparator configured to compare the pre-integration voltage and a second reference voltage, wherein generation of the integration voltage is modifiable based on the comparison;

a bypass switch coupled in parallel with the coupling capacitor; and a clamp switch configured to clamp the integration voltage to a specified voltage.

9. The system of claim 8, wherein, in each pixel circuit element:

the reset and clamp switches are configured to be closed to reset the CTIA unit cell; and the reset switch is configured to be opened at a beginning of an integration period.

10. The system of claim 9, wherein, in each pixel circuit element, when no high flux condition is detected by the comparator based on the comparison:

the clamp switch is configured to be opened after the beginning of the integration period; and the bypass switch is configured to remain opened during the integration period.

11. The system of claim 9, wherein, in each pixel circuit element, when a high flux condition is detected by the comparator based on the comparison:

the bypass switch is configured to be closed in order to provide the pre-integration voltage as the integration voltage; and the clamp switch is configured to be opened so that the integration voltage is not clamped to the specified voltage.

12. The system of claim 8, wherein, in each pixel circuit element:

the amplifier is configured to receive the electrical current on an inverting input terminal and the first reference voltage on a non-inverting input terminal, the inverting input terminal coupled to an output of the photodetector; and the comparator and the bypass switch are coupled to an output of the amplifier.

13. The system of claim 8, wherein:

in each pixel circuit element, the comparator is configured to generate a detection signal in response to detecting a high flux condition based on the comparison; and the system further comprises at least one controller configured to control operation of the bypass and clamp switches in each pixel circuit element based on the detection signal in order to modify the generation of the integration voltage.

14. The system of claim 8, wherein each pixel circuit element further comprises:

a buffer configured to receive the integration voltage and generate an output signal.

15. The system of claim 8, further comprising:

a data processing system configured to process output signals from the focal plane array and generate one or more images of a scene.

16. A method comprising:

generating an electrical current based on received illumination using a photodetector;

integrating the electrical current using a capacitor transimpedance amplifier (CTIA) unit cell comprising (i) an amplifier configured to receive the electrical current and a first reference voltage and generate a pre-integration voltage, (ii) a feedback capacitor coupled in parallel across the amplifier, (iii) a reset switch coupled in parallel across the feedback capacitor, and (iv) a coupling capacitor coupled to an output of the amplifier and configured to receive the pre-integration voltage and generate an integration voltage;

comparing the pre-integration voltage and a second reference voltage; and controlling generation of the integration voltage based on the comparison;

wherein:

a bypass switch is coupled in parallel with the coupling capacitor;

a clamp switch is configured to clamp the integration voltage to a specified voltage; and controlling the generation of the integration voltage comprises controlling operation of the bypass and clamp switches based on the comparison.

17. The method of claim 16, wherein:

the reset and clamp switches are closed to reset the CTIA unit cell;

the reset switch is opened at a beginning of an integration period;

when no high flux condition is detected based on the comparison, (i) the clamp switch is opened after the beginning of the integration period and (ii) the bypass switch remains opened during the integration period; and when a high flux condition is detected based on the comparison, (i) the bypass switch is closed in order to provide the pre-integration voltage as the integration voltage and (ii) the clamp switch is opened so that the integration voltage is not clamped to the specified voltage.

18. The method of claim 16, wherein:

the amplifier receives the electrical current on an inverting input terminal and the first reference voltage on a non-inverting input terminal, the inverting input terminal coupled to an output of the photodetector; and the comparator and the bypass switch are coupled to an output of the amplifier.

19. The method of claim 16, wherein:

the comparator generates a detection signal in response to detecting a high flux condition based on the comparison; and operation of the bypass and clamp switches are controlled based on the detection signal in order to modify the generation of the integration voltage.

20. The method of claim 16, further comprising:

using a buffer to receive the integration voltage and generate an output signal.

* * * * *